United States Patent [19]
Blumenthal

[11] Patent Number: 5,861,774
[45] Date of Patent: Jan. 19, 1999

[54] APPARATUS AND METHOD FOR AUTOMATED TESTING OF A PROGAMMABLE ANALOG GAIN STAGE

[75] Inventor: Jeffrey Max Blumenthal, Austin, Tex.

[73] Assignee: Advanced Micro Devices, Inc., Sunnyvale, Calif.

[21] Appl. No.: 771,337

[22] Filed: Dec. 16, 1996

[51] Int. Cl.$^6$ .............................. H03F 3/68; G01R 31/02
[52] U.S. Cl. ..................... 330/2; 330/124 R; 324/763
[58] Field of Search .................................. 330/2, 124 R, 330/144, 145, 284, 295; 324/763

[56] References Cited

U.S. PATENT DOCUMENTS 4,794,343  12/1988  Yang .......................................... 330/2

OTHER PUBLICATIONS

A.K. Lu et al. "An Analog Multi–Tone Signal Generator For Built–In–Self–Test Applications", International Test Conference © 1994 IEEE, Paper 27.3, pp. 650–659.

Eiichi Teraoka et al. "A Built–In–Self–Test for ADC and DAC in a Single–Chip Speech CODEC", International Test Conference © 1993 IEEE, Paper 37.1, pp. 791–796.

R.J.A. Harvey et al. "Analogue Fault Simulation Based On Layout Dependent Fault Models", International Test Conference © 1994 IEEE, Paper 27.2, pp. 641 and 648–649.

Ed Flaherty et al. "Design For Testability Of A Modular, Mixed Signal Family Of VLSI Devices" International Test Conference © 1993 IEEE, Paper 37.2, pp. 797–808 and 813–814.

Mustapha Slamani et al. "An integrated Approach For Analog Circuit Testing With A Minimum Number Of Detected Parameters" International Test Conference © 1994 IEEE, Paper 27.1, pp. 631–640.

Eric Kushnick, "Modular Mixed Signal Testing: High Speed Or High Resolution" International Test Conference © 1994 IEEE, Paper 9.4, pp. 286–290.

*Primary Examiner*—James B. Mullins
*Attorney, Agent, or Firm*—Skjerven, Morrill, MacPherson, Franklin & Friel LLP; Ken J. Koestner

[57] ABSTRACT

A Built-In Self-Test (BIST) circuit and test method are employed for automated testing of a programmable analog gain stage. The BIST circuit and operating method advantageously use the natural redundancy of a multiple-channel circuit for detecting circuit faults. More specifically, the BIST circuit utilizes the natural redundancy of the identical signal paths for multiple-channel, such as stereo, audio operation. A left channel and a right channel ideally function identically so that a fault in one channel of the left channel and the right channel signal paths is detected by mutually comparing the operation of the two channels.

27 Claims, 11 Drawing Sheets

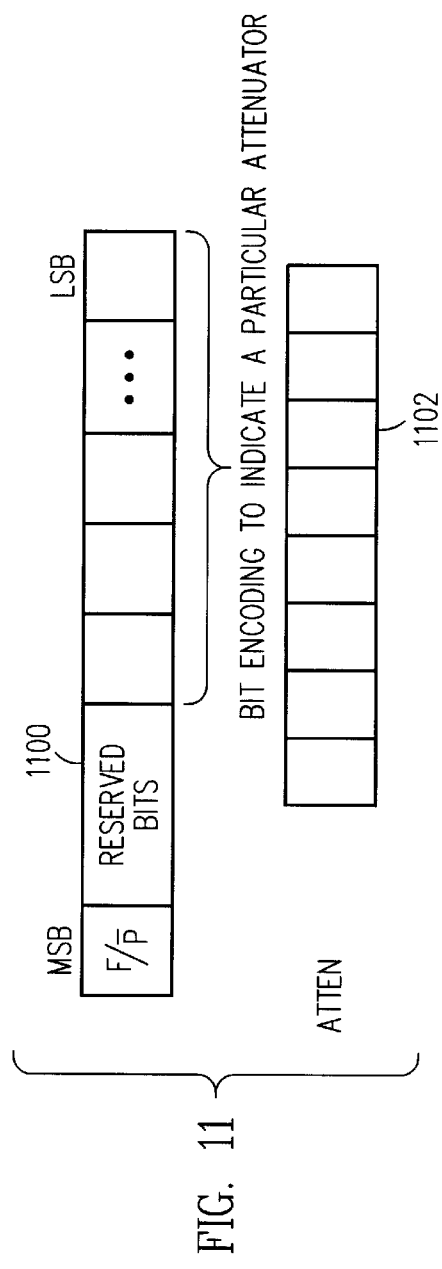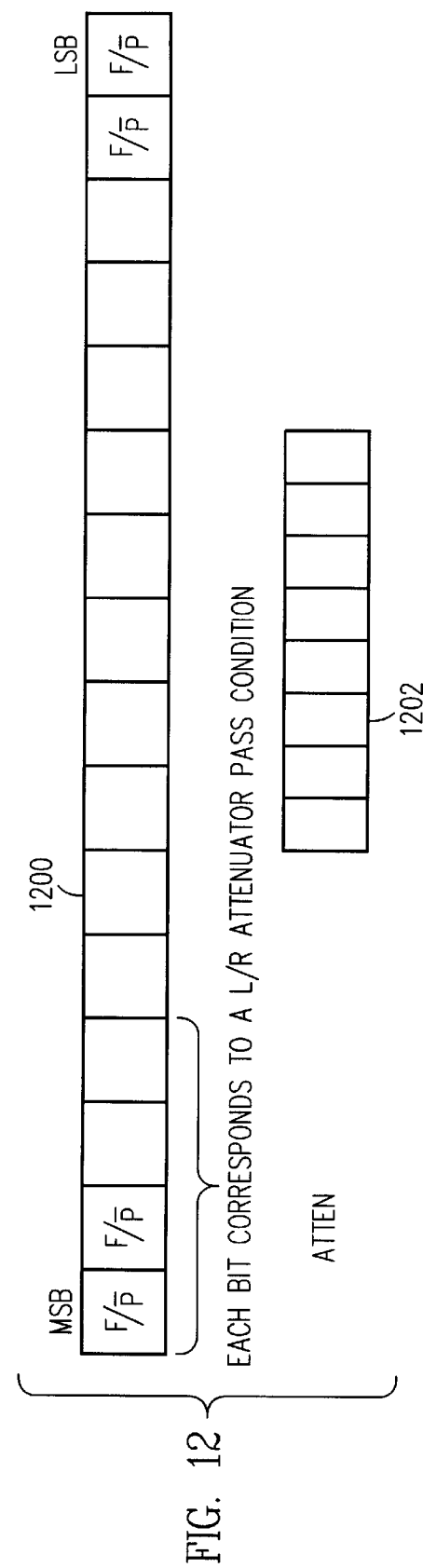

APPARATUS AND METHOD FOR AUTOMATED TESTING OF A PROGAMMABLE ANALOG GAIN STAGE

BACKGROUND OF THE INVENTION

1. Field of the Invention

The present invention relates to a Built-In Self-Test (BIST) circuit. More specifically, the present invention relates to a BIST circuit and operating method for automated testing of a programmable analog gain stage.

2. Description of the Related Art

Mixed analog-digital signal integrated circuits (ICs) are highly useful for signal processing applications such as signal acquisition and generation including synthesis, filtering, modulation and the like. Design goals of signal processing integrated circuits typically seek a reduction in size and cost. Factors determining the total cost of an integrated circuit include manufacturing costs, silicon area, packaging costs, development costs, test vector development, and testing time.

For high volume production of monolithic mixed-signal integrated circuits, two factors contribute to manufacturing costs. A first factor are the direct costs of test equipment and testing time. A second factor are the indirect costs of test procedure development. Testing costs in mixed-signal integrated circuits are dominated by the costs of analog testing despite the relatively small amount of analog circuitry in comparison to digital logic ("A BIST Scheme for an SNR Test of a Sigma-Delta ADC", Toner M. F. and Roberts G. W., International Test Conference 1993, Paper 37.3, page 805).

Costs are reduced by decreasing testing time. Typically, mixed signal integrated circuits are tested using a two-pass test using a wafer sort, a limited testing of the die while attached to a wafer in a first phase and a class test including full analog and digital testing of a packaged part in a second phase. Unfortunately, the first wafer-sort phase of the two-pass test is generally limited in testing for gross functionality of analog blocks. As a result, some die are packaged with nonfunctional analog circuit sections. The packaged circuits are then tested in the second phase, found to be defective and then scrapped. Wasted test time, scrapped packaging and lower throughput inherent in the conventional two-part testing lead to high production costs.

Testing is performed using mixed-signal test equipment including precision programmable analog signal generators, waveform digitizers, and specialized digital signal processing equipment. The testing is costly because of the usage of expensive test equipment. Production costs of mixed-signal integrated circuits are greatly influenced by efficiency of testing.

Recently, cost reductions have been proposed through usage of built-in self-test (BIST) approaches for testing mixed-signal integrated circuits. BIST techniques are advantageous for reducing production time testing by a manufacturer. BIST techniques are further advantageous if the analog portion of the test is filly integrated into the integrated circuit so that only digital signals are passed from an external tester and the integrated circuit. Current BIST approaches employ simple functional testing involving an analysis of digital data converted from analog signals using an embedded analog-to-digital converter (ADC) at the analog input terminals of a device. The resulting digital data is analyzed using histogram methods to calculate parameters including measures of nonlinearity, differential nonlinearity, bandwidth, noise, dynamic range, harmonic distortion and the like.

These BIST approaches require high accuracy, high volumes of data streams for sufficient testing and still require usage of expensive external test equipment to process and analyze the data stream, resulting in a large amount of test time and high testing costs. Furthermore, these BIST methods require the usage of an accurate embedded ADC for conversion of data. Accurate converters are not implemented in some digital signal processing circuits. The inclusion of an ADC for test purposes alone substantially increases the size and cost of an integrated circuit.

What is needed is a BIST test method and apparatus that reduces or avoids the usage of expensive test equipment and reduces the testing time. What is further needed is a BIST test method and apparatus that does not utilize a complex embedded ADC.

SUMMARY OF THE INVENTION

In accordance with the present invention, a Built-In Self-Test (BIST) circuit and test method are employed for automated testing of a programmable analog gain stage. The BIST circuit and operating method advantageously use the natural redundancy of a multiple-channel circuit for detecting circuit faults. More specifically, the BIST circuit utilizes the natural redundancy of the identical signal paths for multiple-channel, such as stereo, audio operation. A left channel and a right channel ideally function identically so that a fault in one channel of the left channel and the right channel signal paths is detected by mutually comparing the operation of the two channels.

In accordance with an embodiment of the present invention, a Built-In Self-Test (BIST) circuit is used for testing a programmable analog gain stage in a multiple-channel system. The BIST circuit includes a first channel programmable attenuator network, a first channel comparator, a second channel programmable attenuator network, and a second channel comparator. The first channel programmable attenuator network has a first input terminal for receiving a reference voltage, a second input terminal for receiving an input signal, a control terminal for receiving a gain control signal, and an output terminal connected to an input terminal of a first channel output voltage amplifier. The first channel comparator has a first input terminal, which may be a positive input terminal, connected to receive a signal selected from an output voltage of the first channel output voltage amplifier and a first channel input voltage (for example, $VIN_L$). The first channel comparator also has a second input terminal, which may be a negative input terminal, connected to receive a signal selected from an output voltage of a second channel output voltage amplifier and the reference voltage. The second channel programmable attenuator network has a first input terminal for receiving a reference voltage, a second input terminal for receiving an input signal, a control terminal for receiving a gain control signal, and an output terminal connected to an input terminal of the second channel output voltage amplifier. The second channel comparator has a first input terminal, which may be a positive input terminal, connected to receive a signal selected from an output voltage of the second channel output voltage amplifier and a second channel input voltage (for example, $VIN_R$). The second channel comparator also has a second input terminal, which may be a negative input terminal, connected to receive a signal selected from an output voltage of the first channel output voltage amplifier and the reference voltage.

The BIST circuit further includes an input switch circuit connected to the first channel programmable attenuator network for alternatively connecting a voltage selected from a test voltage (VBIST) and the first channel input voltage $VIN_L$ to the second input terminal of the first channel programmable attenuator network. The BIST circuit includes a comparator switch circuit connected to the second channel comparator for alternatively connecting a voltage selected from the output voltage of the second channel output voltage amplifier and the second channel input voltage $VIN_R$ to the first (e.g. positive) input terminal and for alternatively connecting a voltage selected from the output voltage of a first channel output voltage amplifier and the reference voltage to the second (e.g. negative) input terminal. The BIST circuit programmable attenuator network has a plurality of input lines for receiving a gain control signal. The BIST circuit further includes a control circuit including an up/down counter and a state machine.

Many advantages are achieved by the described BIST circuit and operating method. One advantage is that the described circuit and operating method lower manufacturing costs by significantly reducing the test time of packaged integrated circuits and allows testing of portions of analog circuits at wafer sort, when the integrated circuit die is attached to the semiconductor wafer, thereby improving the yield of packaged parts. Substantial advantages of the described BIST circuit and operating method are the inherent parallel attributes of the test system in a circuit having multiple gain stages. The BIST circuit implemented for each of the multiple gain stages advantageously allows testing of all of the multiple gain stages in parallel.

An additional advantage is that the time utilized in performing each attenuation step is reduced since the test reference voltage VBIST is applied to all test circuits in parallel and is, therefore, stable among all circuits. A further advantage is that the settling time of the test circuit is reduced since only the programmable attenuator networks and the comparators have a settling time.

BRIEF DESCRIPTION OF THE DRAWINGS

The features of the described embodiments believed to be novel are specifically set forth in the appended claims. However, embodiments of the invention relating to both structure and method of operation, may best be understood by referring to the following description and accompanying drawings.

FIG. 8, including

FIG. 11 is a pictorial illustration showing an embodiment of an addressable test register BIST circuit.

FIG. 12 is a pictorial illustration showing a PASS/FAIL# identification register for identifying failing attenuators that are tested in parallel.

DETAILED DESCRIPTION OF THE PREFERRED EMBODIMENTS

Figure 1:
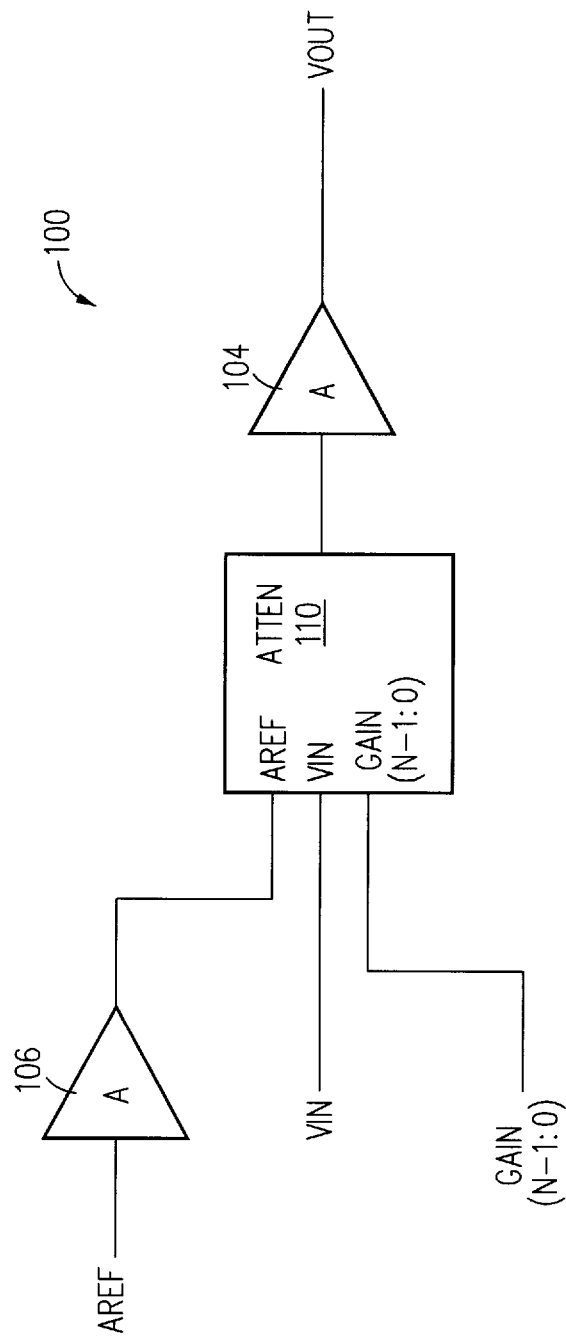
FIG. 1 is schematic block diagram showing an analog gain stage which does not implement built-in self-test (BIST) functionality.

Referring to FIG. 1, a schematic block diagram illustrates an analog gain stage 100 which does not implement a built-in self-test functionality. The analog gain stage 100 includes an output voltage amplifier 104, a reference amplifier 106, and a programmable attenuator network 110 controlled by a control bus GAIN(N-1:0). The output voltage amplifier 104 is an amplifier having a nominal gain of A and a high input impedance. The value of A is any reasonable value and, in a highly suitable embodiment, A is set to unity. A unity gain voltage amplifier is typically constructed from operational amplifiers utilized in a voltage follower configuration in accordance with well-known practice in analog circuit design. The positive input terminal of the output voltage amplifier 104 receives an input signal from the programmable attenuator network 110. The programmable attenuator network 110 receives a reference signal from the reference amplifier 106 at a reference input terminal and an input voltage signal from an input voltage line VIN at a signal input terminal. The programmable attenuator network 110 receives a control signal via the N-bit control bus GAIN(N-1:0) and generates an output signal which is attenuated in dB steps proportional to the GAIN(N-1:0). The reference amplifier 106 is an amplifier having a nominal gain of unity. The input terminal is connected to a reference voltage line AREF and an output terminal connected to the negative input terminal and generates the reference to the programmable attenuator network 110.

A mixed signal integrated circuit (not shown) can include many analog gain stages. In such embodiments, each analog gain stage includes a dedicated programmable attenuator network, each supplied by a control bus. A mixed signal integrated circuit typically uses many seconds of test time dedicated to analog testing alone. For example, an audio codec circuit typically includes a mixer block (not shown) in which a portion of the test time is generally used testing the gain stages associated with each signal path of the mixer.

Figure 2:
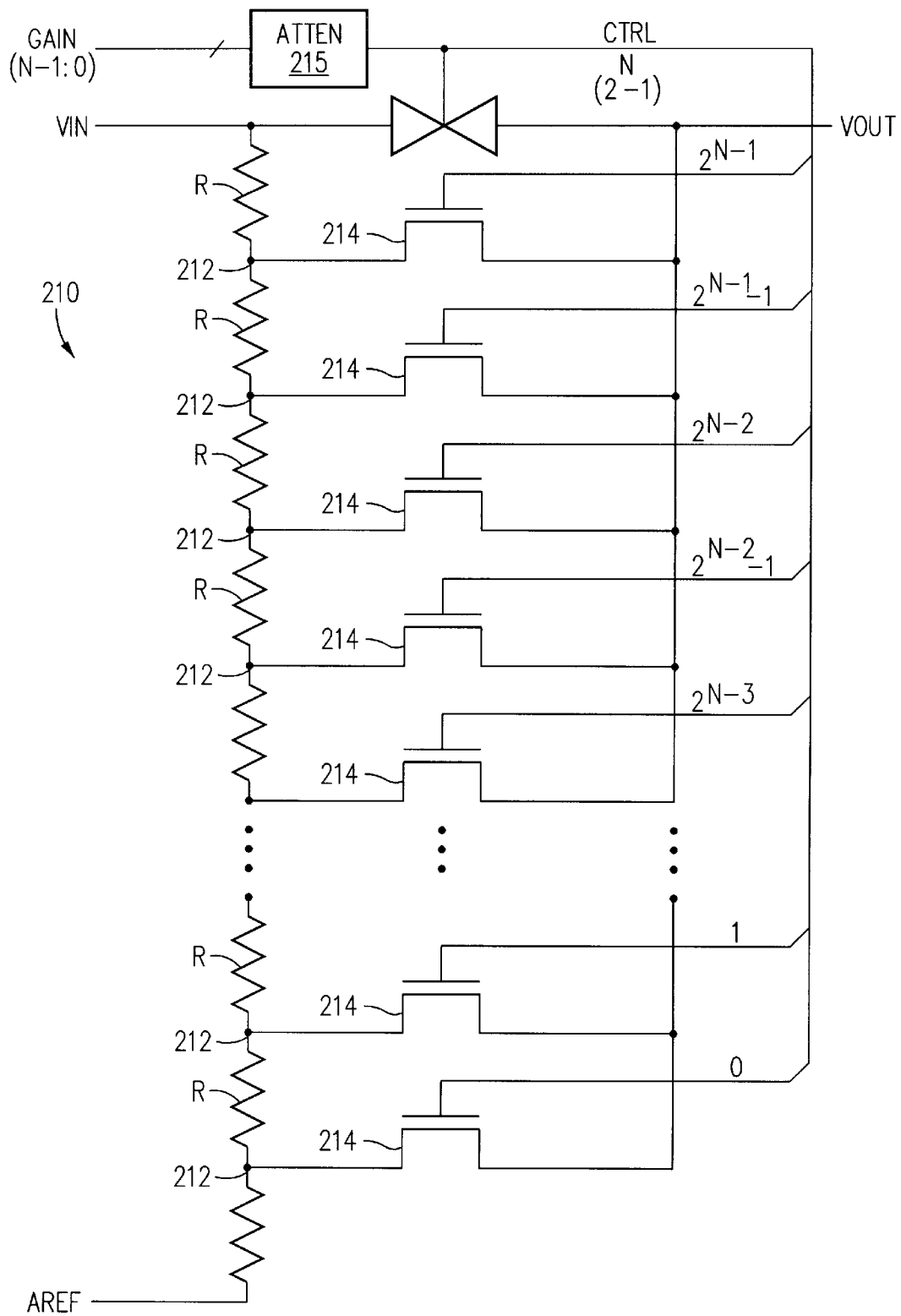
FIG. 2 is a schematic block diagram showing a programmable attenuator network within the circuit illustrated in FIG. 1.

FIG. 2 is a schematic block diagram showing an embodiment of a programmable attenuator network 110 which is suitable for usage in the analog gain stage 100. In this example, the programmable attenuator network 110 is a voltage divider network 210. The voltage divider network 210 includes an attenuator decode circuit 215, a plurality $2^N$ of resistors R connected at a plurality $2^N$ of taps 212 between an input voltage terminal connected to the voltage input terminal VIN and a reference voltage terminal connected to receive a reference voltage from the reference amplifier 106. Each voltage along the voltage divider network 210 is selected using a respective corresponding transistor switch of a plurality $2^N$ of transistor switches 214 that is controlled by a signal of the control bus GAIN(N-1:0) for each combination $2^N$ of the N bits supplied by the programmable attenuator network 110 shown in FIG. 1. The attenuator decode circuit 215 receives the control bus GAIN(N-1:0) for programming the gain value of the programmable attenuator network 110.

The large amount of test time that is used for testing a plurality of gain stages arises from a requirement to test whether each of the plurality of attenuation levels is within a defined tolerance. For example, a circuit using the voltage divider network 210 as a programmable attenuator network 110 tests the plurality $2^N$ of transistor switches 214 and testing to ensure that the relative resistances of the plurality $2^N$ of resistors R are within tolerance. One conventional technique for testing the analog gain stage 100 involves stimulation of the network, for example via IC chip pads and signal paths using a plurality of sine wave input signals applied to the input voltage terminal VIN and measuring the resulting amplitude at the output terminal VOUT for each value of the signal on the control bus GAIN(N-1:0). For each value of the control signal on the control bus GAIN (N-1:0) a substantial amount of test time is disadvantageously employed generating the sine wave test signal, and measuring and processing the output signals resulting from the plurality of sine waves. A further disadvantage is that the conventional analog test methodology is less reliable at the wafer sort phase and more reliable only after the mixed signal integrated circuit has been packaged. Testing at wafer sort is less reliable than class testing for many reasons. Wafer sort testing is performed using a probe and lead wires that are relatively long and therefore susceptible to capacitively-coupled noise and a large self-inductance. Furthermore, wafer sort testing is made difficult because testing is performed at a wide range of temperatures including elevated and lowered temperatures. In addition, prior to packaging, the large size of substrate in the uncut dies leads to heightened noise levels coupled into the substrate nodes of transistors.

Figure 3:
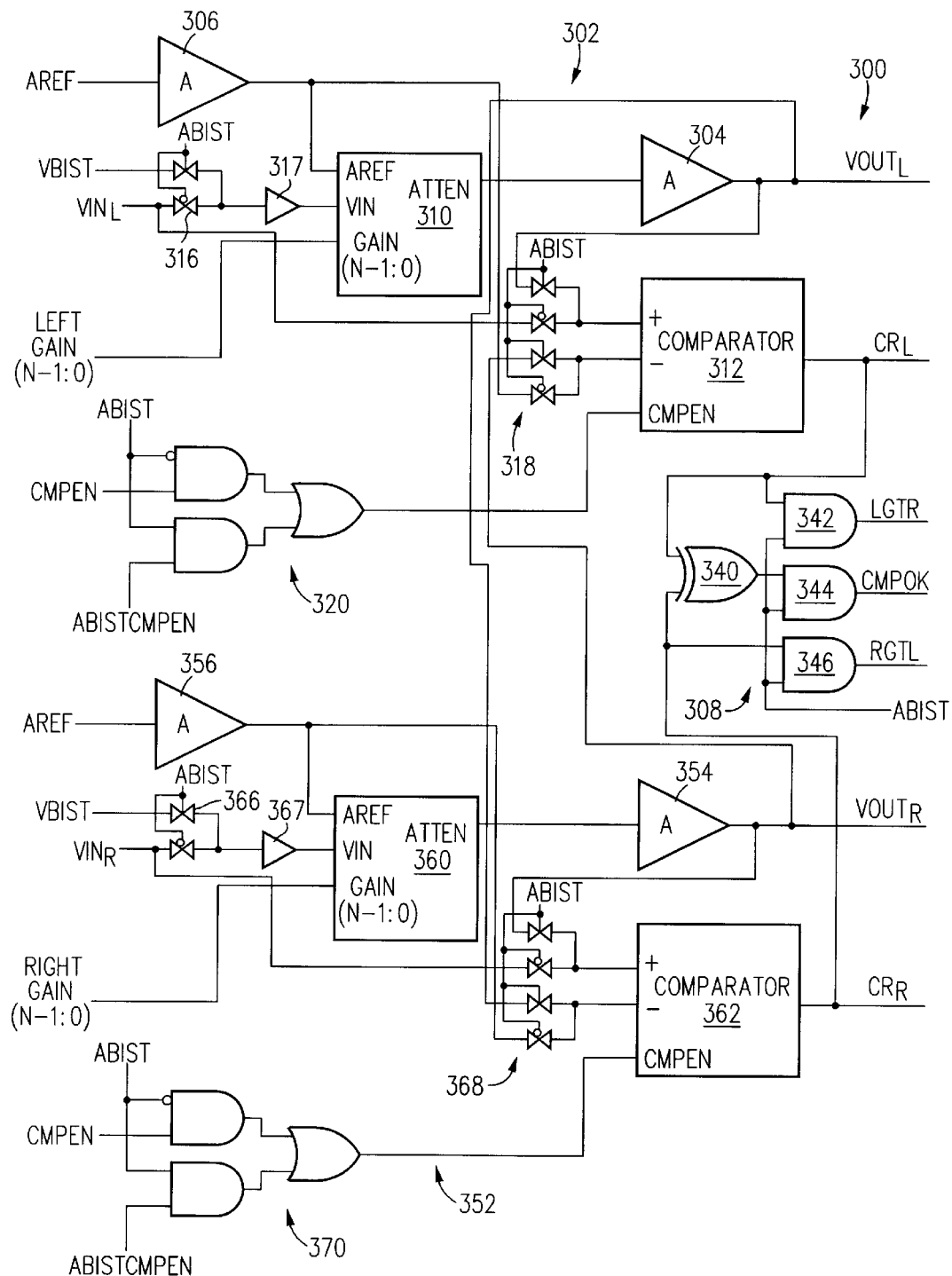
FIG. 3 is a schematic block diagram illustrating a test circuit for automated testing of an analog gain stage in accordance with an embodiment of the present invention.

Referring to FIG. 3, a schematic block diagram illustrates a test circuit 300 for automated testing of a programmable analog gain stage. The illustrative embodiment of the test circuit 300 is a stereo audio circuit having a left channel 302, a right channel 352, and a channel compare logic circuit 308. The left channel 302 and the right channel 352 are substantially identical.

The left channel 302 of the test circuit 300 includes a left channel output voltage amplifier 304, a left channel reference amplifier 306, a left channel programmable attenuator network 310, left channel network multiplexers 316, a left channel comparator 312, left channel comparator multiplexers 318, and a left channel comparator enable circuit 320. The left channel output voltage amplifier 304 is an audio amplifier having a positive input terminal, a negative input terminal, and an output terminal connected to the negative input terminal. The positive input terminal of the left channel output voltage amplifier 304 receives a voltage signal from the left channel programmable attenuator network 310. The comparator multiplexer 318 and the network multiplexer 316 may be implemented using suitable known structures, such as an N- channel-P-channel transistor pair.

The illustrative left channel programmable attenuator network 310 is a tapped resistor network connected between a reference line (AREF) and an input voltage line (VIN) and including a plurality of resistors which are switched at a plurality of taps by decoded control lines of a multiple-bit left gain control value (CTRL). In other embodiments, the programmable attenuator network 310 may be a resistor network, a network of weak (resistive) transistors, a switched-capacitor network, or another type of network that attenuates DC and sinusoidal voltages. For the case of a switched-capacitor network, $\phi_1$ and $\phi_2$ timing signals are supplied. In the illustrative embodiment, the reference line (AREF) of the left channel programmable attenuator network 310 is connected to an output terminal of the left channel reference amplifier 306. The left channel reference amplifier 306 is optional, other embodiments may simply include a reference line AREF which supplies a reference voltage. The left channel reference amplifier 306 is a differential amplifier having a positive input terminal connected to a DC reference voltage supply (AREF) line, a negative input terminal, and an output terminal connected to the negative input terminal. The input voltage terminal (VIN) of the left channel programmable attenuator network 310 is connected to the left channel network multiplexers 316. The left channel network multiplexers 316 are controlled by an analog Built-In Self-Test control signal (ABIST) on an ABIST control line and selects an input voltage from between a voltage input signal (VIN) and a Built-In Self-Test DC stimulus voltage (VBIST). The voltage input signal (VIN) is an audio signal, typically a plurality of cycles of a sine wave at a defined amplitude. In the illustrative embodiment, the VBIST DC stimulus voltage is a two-level voltage function selected from between the DC reference voltage plus a voltage corresponding to a full-scale input amplitude and the DC reference voltage minus the voltage corresponding to the full-scale input amplitude. The left channel programmable attenuator network 310 has a plurality of input lines connected to receive a plurality of left gain control lines (GAIN(N-1:0)).

The left channel comparator 312 is a comparator having a positive input terminal and a negative input terminal which are connected to the left channel comparator multiplexers 318, an enable terminal connected to the left channel comparator enable circuit 320, and an output terminal.

In the embodiment illustrated by FIG. 3, the left channel comparator multiplexers 318 selectively connect the positive terminal of the left channel comparator 312 to either the output terminal of the left channel output voltage amplifier 304 or to the left channel voltage input signal (VIN$_L$) under control of the ABIST control signal. Also controlled by the ABIST control signal at the ABIST control line, the left channel comparator multiplexers 318 selectively connect the negative terminal of the left channel comparator 312 to either the output terminal of the right channel output voltage amplifier 354 or to the output terminal of the left channel reference amplifier 306. When ABIST control signal is asserted, the left channel comparator 312 compares the output voltage of the left channel output voltage amplifier 304 to the output voltage of the right channel output voltage amplifier 354 and generates a digital output signal on a left channel status line CR$_L$ that is asserted when the left channel 302 signal is greater than the right channel 352 signal. With respect to a built-in-self-test functionality, the CR$_L$ signal operates as a "greater than/less than" indicator.

When the ABIST control signal is not asserted, the left channel comparator 318 performs a comparison operation for functionality outside the scope of a BIST operating mode. In alternative embodiments, the left channel comparator multiplexers 318 are simplified so that the input signals to the comparator 312 are fixed and the left channel comparator 312 always compares the output voltage of the left channel output voltage amplifier 304 to the output voltage of the right channel output voltage amplifier 354.

In the illustrative embodiment, the left channel comparator enable circuit 320 is controlled by the ABIST control signal at the ABIST control line, a comparator enable signal (CMPEN) signal at a CMPEN control line, and an ABISTCMPEN enable signal at an ABISTCMPEN control line. When the ABIST signal is set, the left channel comparator 312 is enabled when the ABISTCMPEN signal is set. When the ABIST signal is reset, the left channel comparator 312 is enabled when the CMPEN signal is set. In an alternative embodiment of the test circuit 300, the comparator enable circuit 320 may be omitted and a comparator without a CMPEN control input may be substituted.

The right channel 352 of the test circuit 300 includes a right channel output voltage amplifier 354, a right channel reference amplifier 356, a right channel programmable attenuator network 360, right channel network multiplexers 366, a right channel comparator 362, right channel comparator multiplexers 368, and an optional right channel comparator enable circuit 370, all of which are connected in the manner of corresponding blocks of the left channel 302 blocks.

When ABIST is asserted, the network multiplexers 316 and 366 respectively connect input voltages so that the programmable attenuator networks 310 and 360 receive the VBIST DC STIMULUS voltage at the VIN terminal and the AREF voltage at the AREF line. The comparator multiplexers 318 connect voltages so that the comparator 312 receives the VOUT (left channel) voltage at the positive input terminal and the VOUT (right channel) voltage at the negative input terminal. Similarly, the comparator multiplexers 368 connect voltages so that the comparator 362 receives the VOUT (right channel) voltage at the positive input terminal and the VOUT (left channel) voltage at the negative input terminal. In alternative embodiments, the right channel comparator multiplexers 368 are simplified so that the input signals to the comparator 362 are fixed and the right channel comparator 362 always compares the output voltage of the right channel output voltage amplifier 354 to the output voltage of the left channel output voltage amplifier 304.

Accordingly, during operation in the self-test mode, the output voltage at VOUT of the right channel is applied to the negative input terminal of the comparator 312 of the left channel and the output voltage at VOUT of the left channel is applied to the positive input terminal of the comparator 312. At the same time, the output voltage at VOUT of the left channel is applied to the negative input terminal of the comparator 362 of the right channel and the output voltage at VOUT of the right channel is applied to the positive input terminal of the comparator 362. Thus the left channel comparator 312 checks to determine whether the output voltage at VOUT of the left channel is more positive than the output voltage at VOUT of the right channel at the same time as the right channel comparator 362 checks to determine whether the output voltage at VOUT of the right channel is more positive than the output voltage at the output terminal VOUT of the left channel.

In the illustrative embodiment, when ABIST is inactive, the network multiplexers 316 and 366 respectively connect input voltages so that the programmable attenuator networks 310 and 360 receive the input voltages $VIN_L$ and $VIN_R$, respectively, at voltage input terminals of the left and right attenuators. The programmable attenuator networks 310 and 360 also receive the AREF voltage at the AREF line. The comparator multiplexers 318 connect voltages so that the comparator 312 receives the $VIN_L$ voltage at the positive input terminal and the AREF voltage at the negative input terminal. Similarly, the comparator multiplexers 368 connect voltages so that the comparator 362 receives the $VIN_R$ voltage at the positive input terminal and the AREF voltage at the negative input terminal.

The illustrative channel compare logic circuit 308 includes an exclusive-OR gate 340 and three AND-gates 342, 344, and 346. The exclusive-OR gate 340 has a first input terminal connected to the output terminal of the left channel comparator 312 at the left channel status line $CR_L$, a second input terminal connected to the output terminal of the right channel comparator 362 at a right channel status line $CR_R$, and an output terminal. The AND-gate 342 has a first input terminal connected to the output terminal of the left channel comparator 312 at the left channel status line $CR_L$, a second input terminal connected to the ABIST control line, and an output terminal generating a left channel greater than right channel (LGTR) status signal at a LGTR status line. The AND-gate 344 has a first input terminal connected to the output terminal of the exclusive-OR gate 340, a second input terminal connected to the ABIST control line, and an output terminal generating a comparator is operational (CMPOK) status signal on a CMPOK status line. The AND-gate 346 has a first input terminal connected to the output terminal of the right channel comparator 362 at the right channel status line $CR_R$, a second input terminal connected to the ABIST control line, and an output terminal generating a right channel greater than left channel (RGTL) status signal at a RGTL status line.

In an alternative embodiment, a channel compare logic circuit omits the AND gates 342, 344, and 346 and the signal on the right channel status line $CR_R$ and the left channel status line $CR_L$ respectively supply the right channel (RGTL) status signal at a RGTL status line and the left channel (LGTR) status signal at a LGTR status line.

The channel compare logic circuit 308 is connected to the left channel comparator 312 and to the right channel comparator 362. When the ABIST control signal is asserted, the channel compare logic circuit 308 generates signals indicative of the relative amplitude of the output voltage of the output voltage amplifiers of the left and right channels including a signal that is asserted when the output voltage of the left channel is greater than the output voltage of the right channel (LGTR) and a signal that is asserted when the output voltage of the right channel is greater than the output voltage of the left channel (RGTL). The exclusive-OR gate 340 of the channel compare logic circuit 308 generates a signal indicating that the comparator is operational (CMPOK) when the LGTR and the RGTL signals are in agreement.

In a highly suitable embodiment, the network multiplexers 316 and 366 are implemented as CMOS transfer gates and implemented such that substantially no signal current flows through the transfer gates. Such current flow is disadvantageous since nonlinear capacitance associated with the transfer gates introduces signal distortion. Signal distortion also results from the on-resistance $R_{ON}$ of the network multiplexers 316 and 366 implemented as CMOS transfer gates. To reduce signal distortion, buffering operational amplifiers 317 and 367 in a voltage-follower configuration are inserted between the output terminals of the CMOS transfer gates (316 and 366) and the input terminals of the programmable attenuator networks 310 and 356.

Signal distortion is also reduced by configuring the circuit so that the output terminal of the programmable attenuator networks 310 and 360 is connected to a high impedance, for example to a positive input of an operational amplifier (304 and 354, for example) configured as a voltage follower. This signal distortion is generally not a problem when the voltage VBIST is a DC voltage.

In an alternative embodiment, the left channel 302 and the right channel 352 are respectively connected to two separate voltage sources instead of the single VBIST voltage shown derived from the bandgap voltage reference. In this embodiment, the two separate voltage sources are set to approximately the same DC voltage but differ by one-half the attenuator step size to supply a tighter range for matching of the programmable attenuator networks 310 and 360. In further such embodiments, the two separate voltages may be supplied externally from a tester since the tester may have much higher precision for controlling the absolute value of the voltage than an on-chip bandgap reference. However, disadvantages of a voltage supplied by a tester are external noise coupling and a substantially longer settling time (for example, about 10 msec) than is obtained using an on-chip voltage source.

In an alternative embodiment, only a single reference amplifier is included rather than separate left and right channel reference amplifiers 306 and 356. The usage of separate reference amplifiers 306 and 356 results in a difference in reference voltage AREF up to a maximum of $V_{OS}$.

Figure 4:
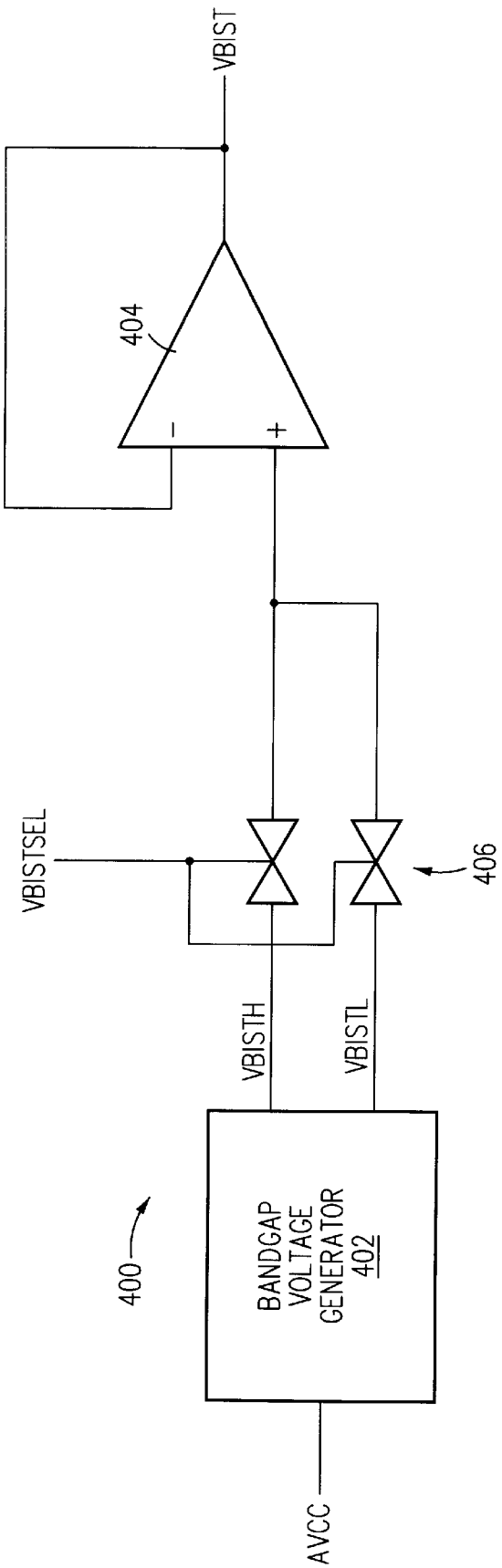
FIG. 4 is a schematic block diagram illustrating a Built-In Self-Test voltage (VBIST) generator circuit for supplying a VBIST voltage to the test circuit shown in FIG. 3.

The test circuit 300 is driven with signals generated by a Built-In Self-Test voltage (VBIST) generator circuit 400 which is shown in a schematic block diagram in FIG. 4. The VBIST generator circuit 400 also generates a reference voltage AREF on a reference line AREF (not shown). The AREF voltage is a midpoint signal level about which substantially sinusoidal signal voltages which are generally applied to an integrated circuit oscillate.

The VBIST generator circuit 400 includes a bandgap voltage generator 402, a VBIST amplifier 404 and a VBIST select circuit 406. The VBIST amplifier 404 is included for buffering a voltage signal generated by the bandgap voltage generator 402 and is an operational amplifier having a positive input terminal, a negative input terminal and an output terminal connected to the negative input terminal. The bandgap voltage generator 402 has a supply terminal connected to a low-noise analog VCC supply and two output terminals. One output terminal generates a voltage equal to the DC reference voltage AREF plus a voltage corresponding to a full-scale signal amplitude. Another output terminal generates a voltage equal to the DC reference voltage AREF minus the voltage corresponding to a full-scale signal amplitude. The positive input terminal of the VBIST amplifier 404 is connected to the VBIST select circuit 406 which supplies either the DC reference voltage plus the full-scale signal amplitude or the DC reference voltage minus the full-scale signal amplitude in accordance with a VBIST select signal (VBISTSEL).

In some embodiments of a test circuit, the VBIST generator circuit 400 is omitted and VBISTH and VBISTL signals are supplied by analog test equipment input via a test pin.

Figure 5:
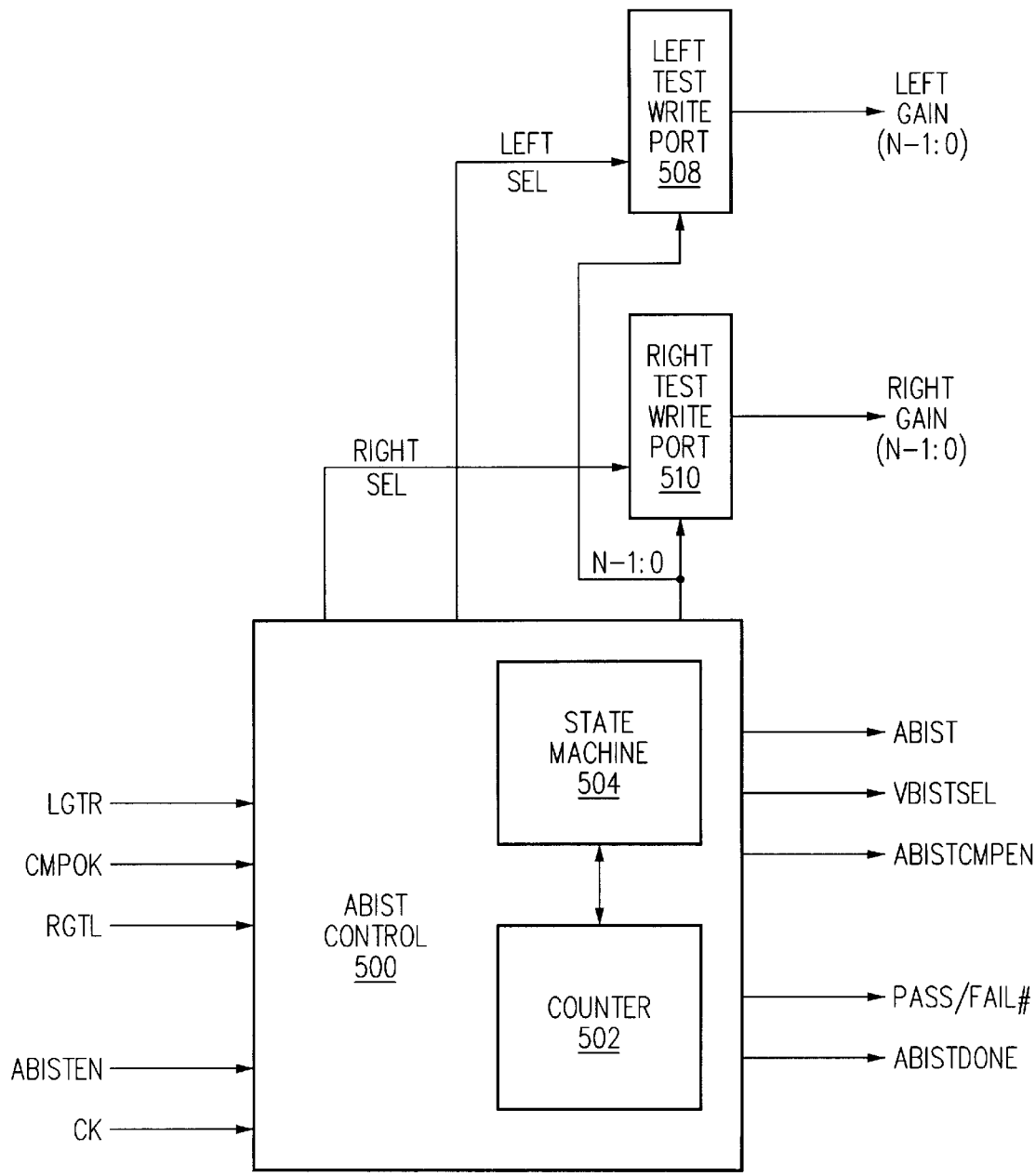
FIG. 5 is a schematic block diagram showing an analog Built-In Self-Test (ABIST) control block for controlling the test circuit shown in FIG. 3.

Referring to FIG. 5, an analog Built-In Self-Test (ABIST) control block 500 is a control block receiving signals from the channel compare logic circuit 308 and generating control signals for application to the network multiplexers 316 and 366 and the comparator multiplexers 318 and 368. The analog Built-In Self-Test (ABIST) control block 500 also generates the PASS/FAIL# result signal. The illustrative ABIST control block 500 is a digital circuit including a counter 502 and a state machine 504 for receiving result signals from the test circuit 300 and generating test signals based on the values of the result signals.

In other various embodiments, the ABIST control block 500 is implemented in different structures. For example, an ABIST control block may be implemented as a circuit on a semiconductor die or implemented as tester code with appropriately dedicated or multiplexed test pins. In other embodiments, an ABIST control block may be implemented using software operating an external test device. Another example is an ABIST control block using software stored in a storage device, such as a ROM, PLA, or Flash Memory and operating from a separate integrated circuit within a computer system.

In further embodiments, the counter 502 is an N bit up-counter or down-counter which generates the left GAIN (N-1:0) signal and the right GAIN(N-1:0) signal for temporary storage in a left channel test write port 508 and a right channel test write port 510, respectively. The Left GAIN(N-1:0) signal and a Right GAIN(N-1:0) signal are stored for application to the left channel programmable attenuator network 310 and the right channel programmable attenuator network 360, respectively.

The state machine 504 receives the LGTR, CMPOK, and RGTL signals from the channel compare logic circuit 308. The state machine 504 also receives an analog Built-In Self-Test (ABIST) enable ABISTEN signal and a clock signal (CK). The ABISTEN signal is typically controlled via an on-chip test register or a multiplexed I/O pad or dedicated test pad. The state machine 504 generates test signals including the ABIST, VBISTSEL, ABISTCMPEN signals for controlling the test circuit 300. The state machine 504 also generates a PASS/FAIL# signal and an ABISTDONE signal for analyzing results of a test.

One substantial advantage of the BIST test circuit 300 is the inherent parallel attribute for usage in a circuit having multiple gain stages. A test circuit 300 implemented for each of the multiple gain stages allows testing of all of the multiple gain stages in parallel by a single ABIST control block. The time utilized in performing each attenuation step is reduced since the test reference voltage VREF is applied to all test circuits 300 in parallel so that stability of the test reference voltage is verified. Furthermore, the settling time of the test circuit 300 is minimal since only the programmable attenuator networks 310 and 360 and the comparators 312 and 362 have a settling time. The LGTR, RGTL, and CNPOK signals in a parallel test are analyzed independently or combined in a suitable manner, for example using an AND function, and analyzed considering the combined signals as a signal from a single BIST test circuit 300.

In an alternative embodiment, the PASS/FAIL# status is set in a multiple bit register with each attenuator network 310 and 360 setting a corresponding bit, allowing tracking of each attenuator separately.

Figure 6:
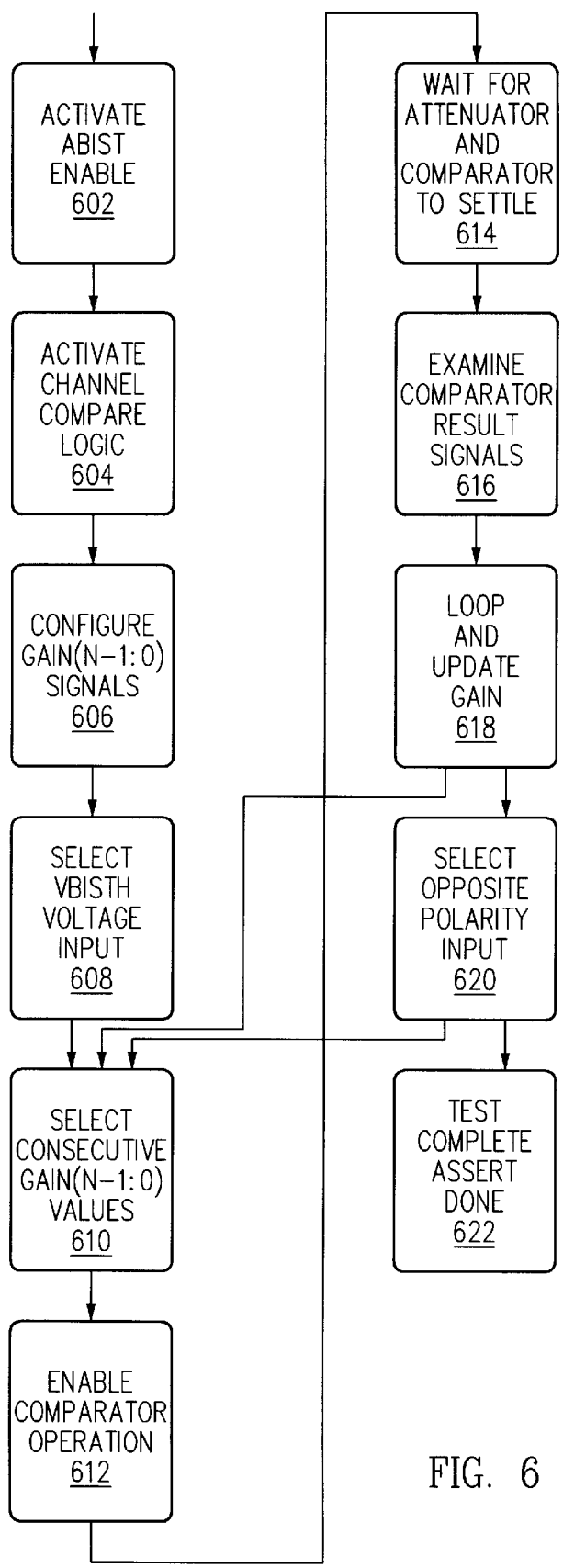
FIG. 6 is a flow chart showing an example of control operations directed by a state machine he ABIST control block.

Referring to FIG. 6, a flow chart illustrates an example of control operations directed by the state machine 504 of the ABIST control block 500. The Analog Built-In Self-Test enable signal (ABISTEN) is activated in step 602 either by setting a bit in an on-chip test register or applying an activating voltage to a dedicated test pad or a multiplexed I/O pad while the clock signal CK oscillates at any suitable clock rate. For example, in mixed-mode integrated circuits, a convenient clock source is an A/D converter or D/A converter sample clock or a suitable multiple of the sample clock. Alternatively, the clock may be applied by tester hardware via a dedicated test pin or a multiplexed I/O pad. A pad is a special structure on an integrated circuit which allows the integrated circuit to be electrically connected to external circuits via bond wires and package pins and the like, or connected to wafer sort hardware via wafer probes.

ABISTEN activation causes initialization and activation of the channel compare logic circuit 308 in step 604 including initialization of the LGTR, CMPOK and RGTL status signals. Also in step 604, the state machine 504 sets the ABIST control signal to an active state.

In step 606, the state machine 504 configures the left GAIN(N-1:0) and right GAIN(N-1:0) signals. In step 608, the state machine 504 initially sets the VBISTSEL control signal for application to the VBIST generator circuit 400 so that the VBIST generator circuit 400 selects the VBISTH voltage, although in other embodiments other initial voltage levels may be used, for example VBISTL. In step 610, left GAIN(N-1:0) and right GAIN(N-1:0) values are set to numerically consecutive integer values, such as 54 for the left channel and 53 for the right channel, and written respectively to the left channel test write port 508 and the right channel test write port 510. A coarser, and therefore faster test may utilize a relative difference in left GAIN(N-1:0) and right GAIN(N-1:0) values of more than one.

The left channel GAIN(N-1:0) is a single count larger than the right channel GAIN(N-1:0) so that the left channel is slightly attenuated, either slightly more or slightly less depending on the configuration of the programmable attenuator network, in comparison to the right channel. For purposes of illustration, the description assumes that the programmable attenuator network attenuates more with a larger GAIN(N-1:0). When the VBIST generator circuit 400 selects the positive VBISTH voltage, the voltage at the output terminal VOUT of the right channel is slightly more positive than the voltage at the output terminal VOUT of the left channel so long as the test circuit 300 and gain stages are operating properly, due to the slight attenuation of the left channel. The left channel comparator 312, the right channel comparator 362, and the channel compare logic circuit 308 are connected to confirm the operation of the test circuit 300. The exclusive-OR gate 340 determines whether the output status signals of the comparators 312 and 362 agree that the left channel is more attenuated than the right.

In step 612, the ABISTCMPEN signal is asserted until the end of step 616 to enable operation of the comparators 312 and 362. The state machine 504 waits to allow the left channel programmable attenuator network 310 and the right channel programmable attenuator network 360 to settle and the output of the comparators 312 and 362 to settle in step 614. In step 616, the state machine 504 examines the LGTR, CMPOK and RGTL result status signals and updates the PASS/FAIL# signal according to the values of the result signals. The PASS/FAIL# signal is initially asserted in the "PASS" state during test initialization and becomes asserted in a fixed "FAIL#" state if a failure occurs. Once the FAIL# state occurs, the circuit cannot be changed back to the PASS state except by restarting the entire built-in self-test.

In a loop step 618, the state machine 504 loops back to step 610 and changes the values of the left GAIN(N-1:0) and right GAIN(N-1:0) signals so that all pairs of consecutive integer numbers are compared or the closest attenuator levels are compared if the gain to the attenuator function is not monotonic. After all pairs of consecutive integer numbers or attenuator levels have been compared, in step 620 the state machine 504 changes the VBISTSEL signal to select the VBISTL voltage, resets the left GAIN(N-1:0) and right GAIN(N-1:0) signals to an initial pair of values, and loops back to step 610. Accordingly, VBISTSEL initially selects the VBISTH voltage for the first loop of all consecutive integer pairs or attenuator levels, then selects the VBISTL voltage for subsequent loops. By switching to the VBISTL voltage, the test is repeated with the right channel more negative with respect to AREF than the left channel.

Figure 7:
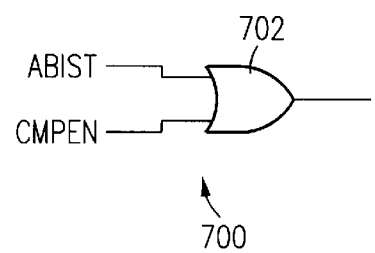
FIG. 7 is a schematic circuit diagram showing a simplified embodiment of the comparator enable circuit.

In an alternative embodiment, the comparator enable circuits 320 and 370 shown in FIG. 3 are simplified to a form illustrated in FIG. 7 in which the comparator enable circuit 700 is an OR gate 702 receiving the ABIST signal and the CMPEN signal at input terminals to produce an output signal to enable comparators 312 and 362. Using the comparator enable circuit 700, the OR gate 702 allows the comparator to evaluate constantly during built-in self-test operation. In other embodiments of a gain stage, the comparator is constantly enabled in normal operation so that the comparator enable circuit is eliminated.

The VBISTH and VBISTL voltage values corresponding to the reference voltage AREF plus the full-scale positive voltage and AREF minus the full-scale positive voltage, respectively, are useful for controlling the test circuit 300 to perform a sequence of tests using both positive and negative polarity signal comparisons. Combined positive and negative polarity testing is superior to single polarity analysis alone because combined testing checks conditions of DC current flow in both directions within the tested circuit, thereby allowing monitoring of more fault mechanisms than is achieved with single polarity testing.

The described test method and apparatus functions appropriately whether the attenuation is a linear or monotonic function so long as the attenuation function is univalent. In some embodiments or tests, the comparison loops using the VBISTL voltage may be omitted or other attenuation combinations are tested. Furthermore, other testing procedures utilize GAIN(N-1:0) values that differ by more than one count in the left and right channels. Typically, a conventional comparator circuit utilizing current CMOS technology detects voltage differences on the order of one millivolt and for the illustrative implementation a one step change of the GAIN(N-1:0) value corresponds to an attenuation change of as little as five millivolts. For some circuits and fabrication processes, comparator resolution and attenuator stepsize may be more coarse or more fine. The attenuation values applied to the different channels are selected accordingly to larger or smaller difference values.

In step 622, testing is completed and the state machine 504 asserts the ABISTDONE signal. The PASS/FAIL# and ABISTDONE bits are available for analysis, for example, by accessing signals on dedicated or multiplexed test pads or reading test result bits from a readable register through a conventional register access protocol as is known in the art of computers, electronics and test systems.

In an example of a loop of the control operations depicted in FIG. 6, the left channel programmable attenuator network 310 is set to a value of 54 and the right channel programmable attenuator network 360 is set to 53. Both the left and right channels having the same DC reference voltage (AREF) value and the same DC stimulus, VBISTH. As a result, a properly executing test circuit 300 generates an output voltage VOUT in the left channel 302 and the right channel 352 that differ by the attenuation factors represented by the values 53 and 54. If the maximum input offset voltage of the left channel comparator 312 and the right channel comparator 362 is less than the attenuation difference for the selected values (here, 53 and 54), then the indication of the CMPOK is asserted by the channel compare logic circuit 308 and the state machine examines the LGTR and RGTR signals and determines a PASS/FAIL# result signal. If the smallest attenuation difference for any two values of the attenuation registers of the left channel programmable attenuator network 310 and right channel programmable attenuator network 360 is larger than the maximum input offset voltage of the left and right channel comparators, then the gross functionality of the left and right channel programmable gain stages are mutually verified. A deassertion of the CNPOK signal indicates that the comparators 312 and 362 are not functioning correctly, leading to a result of FAIL.

This test method assumes that for a fault in one channel, the other channel is fault-free and defect-free. Therefore, if one channel is assumed to be operating correctly, that is, attenuating the correct amount for any selected GAIN(N-1:0) value, the other channel must be attenuating the same input voltage within an attenuation step of the first channel to "PASS" the test. The output signals of the left channel comparator 312 and the right channel comparator 362 are combined into three signals including left greater than right (LGTR), right greater than left (RGTL), comparators functioning properly (CMPOK). The CMPOK signal indicates that the left channel comparator 312 and the right channel comparator 362 are consistent in assessing the amplitude of the relative output signals. If the comparator results are inconsistent, either one of the comparators is faulty or a comparator has an input offset voltage greater than the difference in the output signals of the left channel output voltage amplifier 304 and the right channel output voltage amplifier 354.

In another alternative embodiment, the CMPOK signal is eliminated and the state machine function performs the XOR operation on the LGTR and RGTL signals to determine whether the comparisons are valid.

The described test circuit 300 and operating method advantageously expedite analog testing of the semiconductor die, particularly for a die which includes a digital circuit section which is also tested since the analog built-in self-test is appropriately performed at the same time as the digital tests. The described test circuit 300 and operating method advantageously accelerates the test time of a die that includes only analog testing of circuits if conventional test methods are used to verify gross functionality of the programmable analog gain stage. Such conventional testing includes, for example, applying a sinusoidal stimulus at one or more representative attenuation values.

Figure 8A:
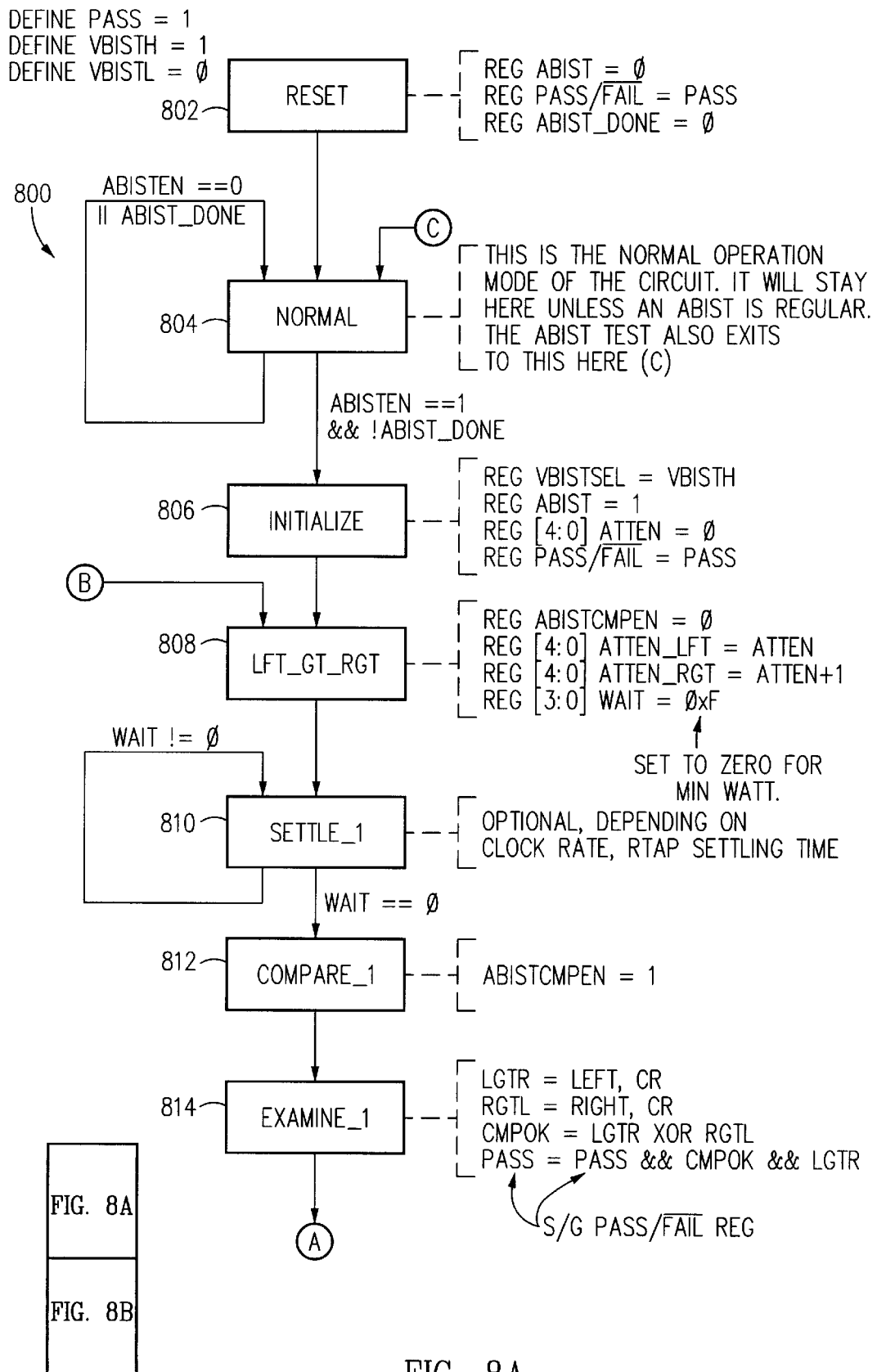
FIGS. 8A and 8B, is a flow chart illustrating operations performed by an embodiment of the state machine shown in FIG. 5.
Figure 8B:
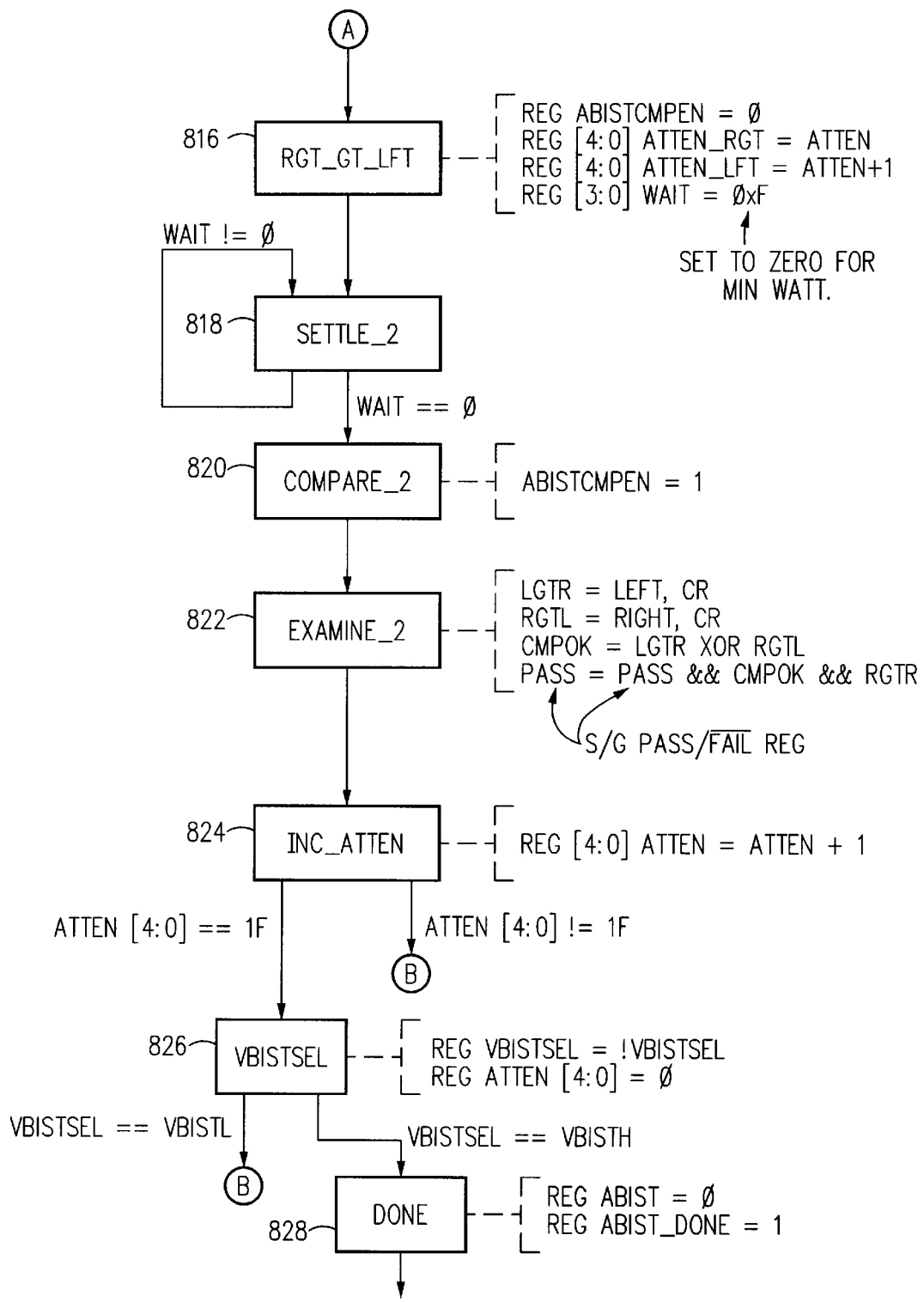

Referring to FIG. 8, a flow chart illustrates operations performed by an embodiment of the state machine 504. In a reset state 802, an ABIST control signal register is set to zero, a PASS/FAIL# register is set to a "PASS" state, and an ABIST_DONE register is set to zero. After the reset state 802, the circuit performs normal operations in a normal state 804 which lasts indefinitely until an ABIST signal is requested. When the ABIST signal is requested, an initialize state 806 is entered in which a VBISTSEL signal is set to VBISTH, the ABIST control signal register is set, the attenuation register ATTEN[4:0] is initialized to zero, and the PASS/FAIL# register is set to the PASS state.

In a left-greater-than-right state 808, the ABISTCMPEN register is initialized to zero, the left attenuation register ATTEN_LEFT[4:0] is set to the value of the ATTEN[4:0] register and the right attenuation register ATTEN_RIGHT[4:0] is set to the value of the ATTEN[4:0] register plus one. A WAIT[3:0] register is set to a variable hexadecimal number 0xF, where a value of zero results in a minimum wait period. In some embodiments, the settling time WAIT register is a register that is initialized prior to a test, typically using a tester, to allow for flexible testing. An optional first channel settling state 810 is employed, depending on the clock rate and settling time of the programmable attenuator networks. Following the settling state 810, a first channel compare state 812 sets the ABISTCMPEN signal to cause a comparison to take place. Results of the comparison are examined during a first channel examine state 814 in which a LGTR signal is set to the left channel comparator result (LEFT.CR) signal value, a RGTL signal is set to the right channel comparator result (RIGHT.CR) signal value, a CMPOK signal is set to the value of LGTR XOR RGTL, and a PASS signal is set to the logical AND of the PASS, CMPOK and LGTR signals.

In a right-greater-than-left state 816, the ABISTCMPEN register is initialized to zero, the right attenuation register ATTEN_RIGHT[4:0] is set to the value of the ATTEN[4:0] register and the left attenuation register ATTEN_LEFT[4:0] is set to the value of the ATTEN[4:0] register plus one. A WAIT[3:0] register is set to a variable hexadecimal number 0xF, where a value of zero results in a minimum wait period. An optional second channel settling state 818 is employed, depending on the clock rate and settling time of the programmable attenuator networks. Following the settling state 818, a second channel compare state 820 sets the ABISTCMPEN signal to cause a comparison to take place. Results of the comparison are examined during a second channel examine state 822 in which a LGTR signal is set to the left channel comparator result (LEFT.CR) signal value, a RGTL signal is set to the right channel comparator result (RIGHT.CR) signal value, a CMPOK signal is set to the value of LGTR XOR RGTL, and a PASS signal is set to the logical AND of the PASS, CMPOK and RGTL signals.

In an increment attenuator state 824, the ATTEN[4:0] register is incremented by one. If the ATTEN[4:0] register is incremented to a value less than a predetermined maximum gain value, for example IF, then the state machine 504 branches to the left-greater-than-right state 808. Otherwise, a VBIST select state 826 is entered in which the VBISTSEL single-bit register is complemented and the attenuator register ATTEN[4:0] is set to zero. If the result of the VBIST select state 826 operation is VBISTSEL equal to VBISTH, then the state machine 504 branches to the left-greater-than-right state 808. Otherwise, the test is complete and a DONE state 828 is entered in which ABIST is reset to zero and the ABIST_DONE register is set to one.

The ABIST_DONE register may be monitored externally via a read-only register to monitor the test for completion.

An ABIST enable signal ABISTEN only has an effect once during the operation of the state machine 504 so that the circuit is reset to perform multiple tests.

Figure 9:
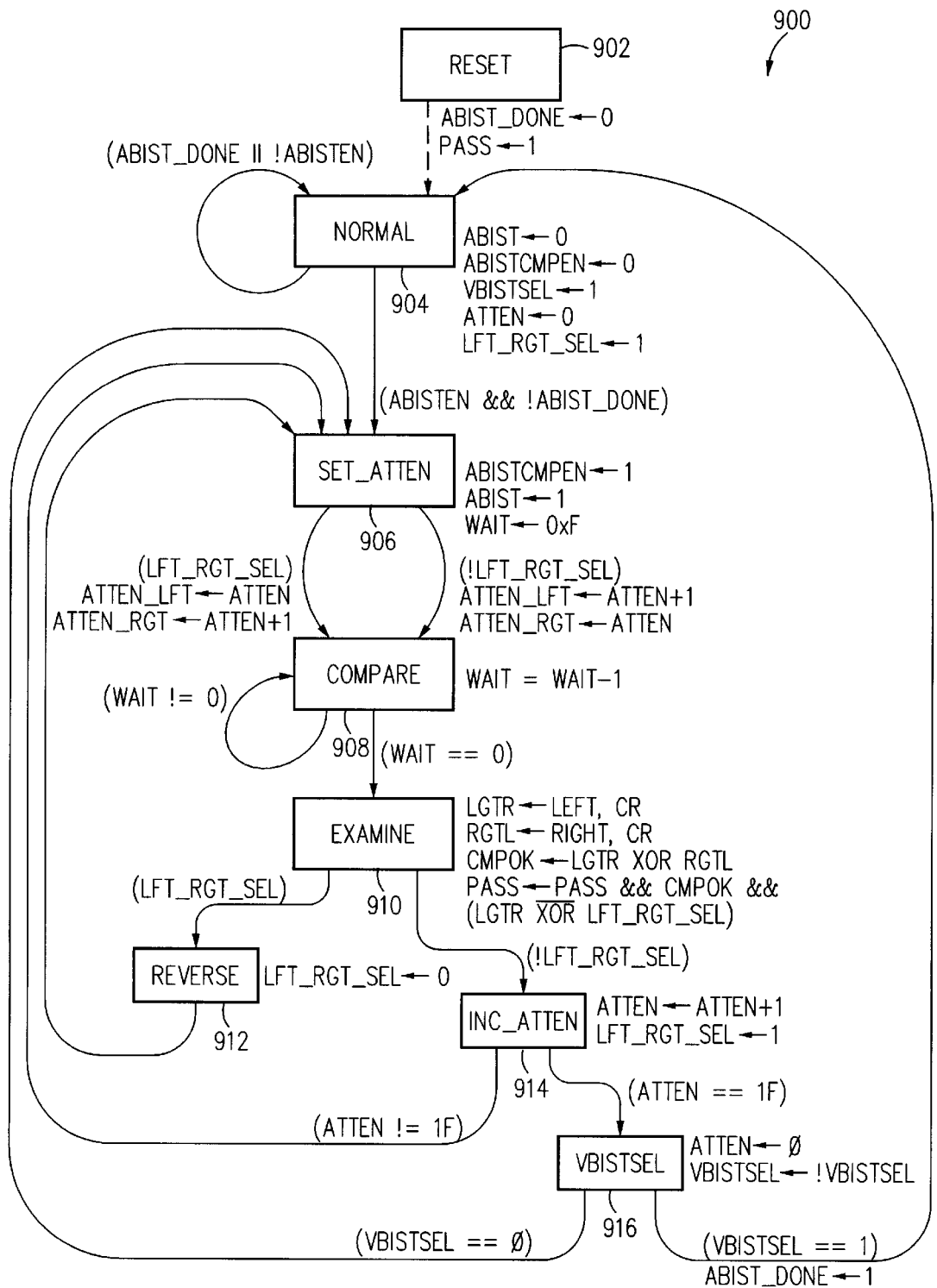
FIG. 9 is a Mealy state diagram which reduces and simplifies the state diagram shown in FIG. 8.

Referring to FIG. 9, a Mealy state diagram 900 is illustrated which reduces and simplifies the state diagram shown in FIG. 8. The Mealy state diagram 900 shows a reset state 902, a normal state 904, a set attenuator state 906, a compare state 908, an examine state 910, a reverse state 912, an increment attenuator state 914, and a VBISTSEL state 916. In the Mealy state diagram 900, expressions within parenthesis resolve Boolean values which determine a conditional flow direction. A left arrow indicates an assignment of registers. Register assignments made during a state are indicated at the right of a state block. Register assignments made during a transition between states are indicated at the right of the transition arrows.

An attenuation value ATTEN[4:0] of zero corresponds to no attenuation. An attenuation value ATTEN[4:0] of IF (Hex) corresponds to maximum attenuation.

In the Mealy state diagram 900, the WAIT loop is moved to a position subsequent to the assignment of left and right attenuation registers and previous to the examine state 910. The WAIT loop is used to allow the programmable attenuator network and the comparator to settle prior the determination of a PASS/FAIL# status.

The function XOR# in the examine state 910 represents the inversion of XOR (for example, the XNOR function of the EQUIVALENCE function).

The ABIST and ABISTCMPEN signals are equivalent in the Mealy state diagram 900 and may be combined in a single signal ABIST.

Figure 10:
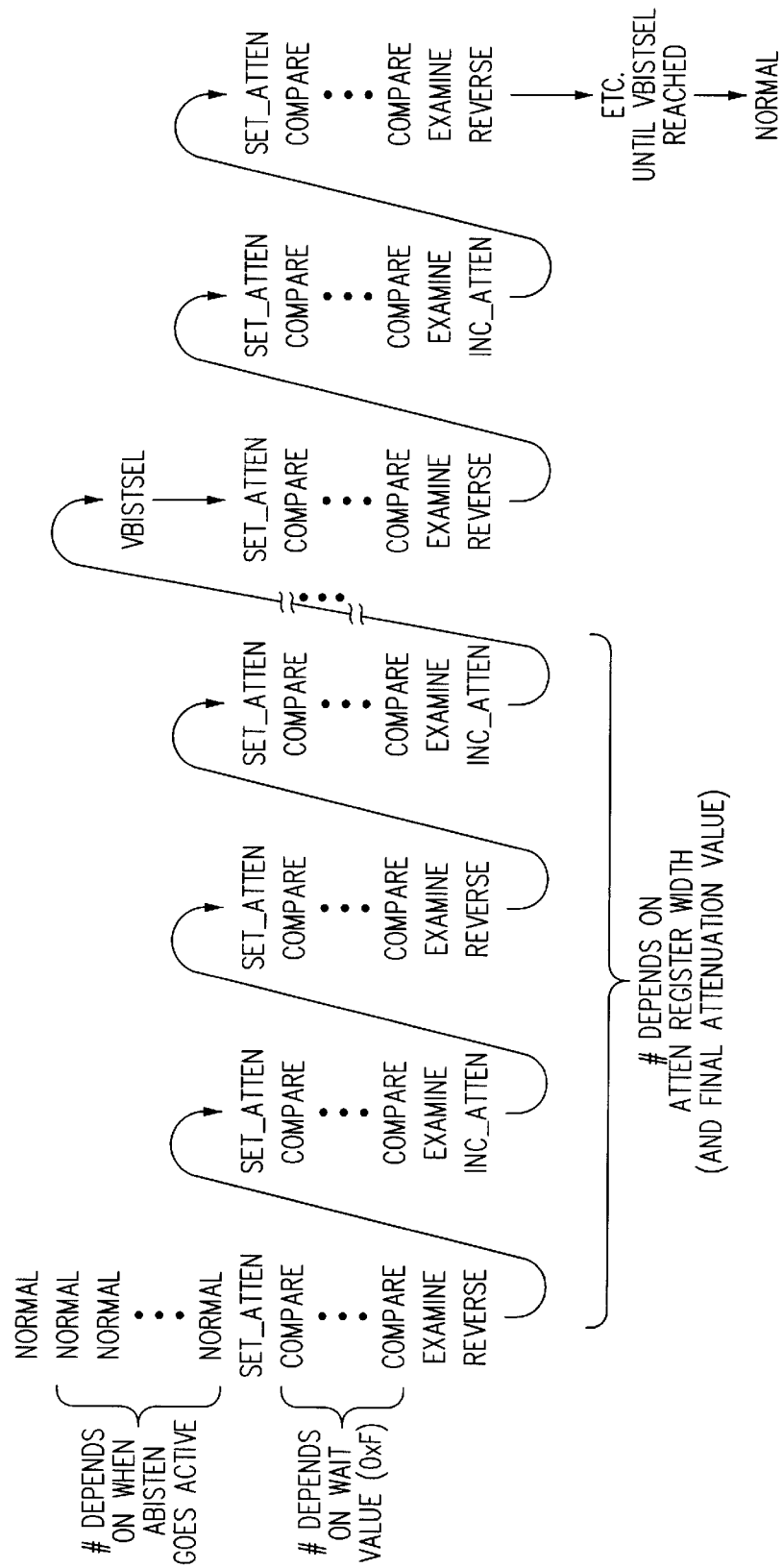
FIG. 10 is a state diagram showing a typical sequence of state transitions for an ABIST test based on the state machine shown in FIG. 9.

In some embodiments the target comparator used in compare state 908 and the examine state 910 for comparing the left and right attenuation voltages is characterized by positive feedback or hysteresis. In these embodiments, the ABISTCMPEN signal is activated after the registers in the attenuation networks change, after a suitable settling time, and deactivated after the examine state 910. FIG. 10 is a state diagram showing a typical sequence of state transitions for an ABIST test based on the state machine shown in FIG. 9.

Referring to FIG. 11, a pictorial illustration shows an embodiment of an addressable test register 1100 for the BIST circuit. The addressable test register 1100 is accessible using a typical input/output interface of an integrated circuit. The test register 1100 is placed in a write-accessible state when a test mode pin or plurality of test mode pins are set to a defined state at the end of a power-up reset signal. For example, the trailing edge of the powerup-reset signal latches a write-enable status that allows write operations to the test register 1100. Access to the test register 1100 is limited to prevent system users from accidentally enabling test mode or activating BIST circuitry.

The test register 1100 includes a PASS-FAL flag (F/P#) having read-only accessibility and a plurality of flags for identifying a failing attenuator of a plurality of attenuators.

In one illustrative test procedure, each attenuator of a plurality of attenuators are tested sequentially. A first attenuator is tested and, if a test fails, the PASS-FAIL bit (FI/P#) is made indicative that a failure condition has occurred at the detected point of failure. An attenuation register 1102 for the failing attenuator is set to a value indicating the detected point of failure. One limitation of this illustrative test procedure is that testing of multiple attenuator/ gain stages is performed inefficiently.

Referring to FIG. 12, illustrates an embodiment of a PASS/FAIL# identification register 1200 for identifying failing attenuators that are tested in parallel. The PASS/FAL# identification register 1200 includes a plurality of bits, each of which holds a PASS-FAIL /P#) status corresponding to a left/right attenuator pair. In operation, the PASS/FAIL# identification register 1200 is initialized to a uniform setting, for example all zeros, to indicate a pass condition of all attenuators. A "pass" indication allows corresponding attenuation registers to be updated during a test. A "fail" indication prevents an attenuation register 1202 from updating, thereby freezing the failing attenuation value for debug purposes.

The PASS/FAIL# identification register 1200 is writable by a tester so that the tester controls continuation of a test upon occurrence of a failure by restoring a PASS condition. The PASS/FAIL# identification register 1200 is therefore helpful for debug and failure analysis via the tester. The capability to dynamically continue a test in this manner is enabled by providing a test clock signal that is stopped while the tester reads and writes the PASS/FAIL# identification register 1200. The tester also performs a "continue on fail" operation to allow debugging and analyzing of packaged circuit that have failed (customer return circuits). The tester also performs a production mode of a "stop on fail" operation for typical testing which advantageously reduces test time.

While the invention has been described with reference to various embodiments, it will be understood that these embodiments are illustrative and that the scope of the invention is not limited to them. Many variations, modifications, additions and improvements of the embodiments described are possible. For example, although the invention is described with respect to a particular programmable amplifier gain stage, additional embodiments may be employed for any type of digitally-controlled multiple-channel gain or attenuator stage.

What is claimed is:

1. A Built-In Self-Test circuit for testing an analog gain stage in a multiple-channel system, the Built-In Self-Test circuit comprising:

a plurality of output voltage amplifiers;

a plurality of programmable attenuator networks, ones of the plurality of programmable attenuator networks having an output terminal coupled to an input terminal of ones of the output voltage amplifiers; and a comparator having a plurality of input terminals, ones of the plurality of input terminals being coupled to output terminals of ones of the plurality of output voltage amplifiers so that the comparator mutually compares the operation of the plurality of output voltage amplifiers.

2. A Built-In Self-Test circuit according to claim 1, further comprising:

a control circuit coupled to the plurality of programmable attenuator networks and coupled to the comparator, the control circuit including:

an operation code for applying test voltages across ones of the plurality of programmable attenuator networks;

an operation code for selecting an attenuation value for attenuating the test voltages;

an operation code for controlling ones of the programmable attenuator network to attenuate the test voltages by the selected attenuation value; and an operation code for applying the attenuated test voltage to ones of the output voltage amplifier under test to generate an output voltage; and an operation code for mutually comparing the output voltages of selected ones of the plurality of output voltage amplifiers.

3. A Built-In Self-Test circuit for testing an analog gain stage in a multiple-channel system, the Built-In Self-Test circuit comprising:

a first channel including:

a first output voltage amplifier having an input terminal and an output terminal; and a first programmable attenuator network having an input terminal for receiving an input voltage, an input terminal for receiving a gain control signal, and an output terminal coupled to the input terminal of the first output voltage amplifier;

a second channel including:

a second output voltage amplifier having an input terminal and an output terminal; and a second programmable attenuator network having an input terminal for receiving an input voltage, an input terminal for receiving a gain control signal, and an output terminal coupled to the input terminal of the second output voltage amplifier; and a comparator having an input terminal coupled to the output terminal of the first output voltage amplifier and an input terminal coupled to the output terminal of the second output voltage amplifier so that the comparator mutually compares the operation of the first channel and the second channel.

4. A Built-In Self-Test circuit according to claim 3, further comprising:

a control circuit coupled to the first and second programmable attenuator networks and coupled to the comparator, the control circuit including:
an operation code for applying test voltages across the first and second programmable attenuator networks;
an operation code for selecting an attenuation value for attenuating the test voltages;
an operation code for controlling ones of the first and second programmable attenuator networks to attenuate the test voltages by the selected attenuation value; and
an operation code for applying the attenuated test voltages to the first and second output voltage amplifiers under test to generate an output voltage; and
an operation code for mutually comparing the output voltages of the first and second output voltage amplifiers.

5. A Built-In Self-Test circuit for testing an analog gain stage in a multiple-channel system, the Built-In Self-Test circuit comprising:
a first channel programmable attenuator network having a first input terminal for receiving a reference voltage, a second input terminal for receiving an input signal voltage, a control terminal for receiving a gain signal, and an output terminal coupled to an input terminal of a first channel output voltage amplifier;
a first channel comparator having a first input terminal coupled to receive a signal selected from an output voltage of the first channel output voltage amplifier and the input signal voltage, a second input terminal coupled to receive a signal selected from an output voltage of a second channel output voltage amplifier and the reference voltage;
a second channel programmable attenuator network having a first input terminal for receiving a reference voltage, a second input terminal for receiving an input signal voltage, a control terminal for receiving a gain signal, and an output terminal coupled to an input terminal of the second channel output voltage amplifier; and
a second channel comparator having a first input terminal coupled to receive a signal selected from an output voltage of the second channel output voltage amplifier and the input signal voltage, a second input terminal coupled to receive a signal selected from an output voltage of the first channel output voltage amplifier and the reference voltage.

6. A Built-In Self-Test circuit according to claim 5, further comprising:
an input switch circuit coupled to the first channel programmable attenuator network for alternatively coupling a voltage selected from a Built-In Self-Test voltage and the input voltage to the second input terminal of the first channel programmable attenuator network.

7. A Built-In Self-Test circuit according to claim 6, wherein the Built-In Self-Test voltage is a two-level voltage function selected from between the reference voltage plus a voltage corresponding to a full-scale gain and the reference voltage minus the voltage corresponding to the full-scale gain.

8. A Built-In Self-Test circuit according to claim 5, further comprising:
a comparator switch circuit coupled to the second channel comparator for alternatively coupling a voltage selected from the output voltage of the first channel output voltage amplifier and the input signal voltage to the first input terminal and for alternatively coupling a voltage selected from the output voltage of the second channel output voltage amplifier and the reference voltage to the second input terminal.

9. A Built-In Self-Test circuit according to claim 5, further comprising:
an attenuator decode circuit having a plurality of input lines for receiving a gain control signal and a plurality of output lines coupled to the control terminal of the first channel programmable attenuator network.

10. A Built-In Self-Test circuit according to claim 5, further comprising:
a control circuit including an up/down counter and a state machine, the control circuit for selectively coupling voltages to the first input terminal and the second input terminal of the first channel comparator.

11. A Built-In Self-Test circuit according to claim 5, further comprising:
a control circuit including an up/down counter and a state machine, the control circuit for determining a gain signal applied to the first channel programmable attenuator network.

12. A method of operating a Built-In Self-Test circuit for testing an analog gain stage in a multiple-channel system, the method comprising:
for a first analog gain stage channel and a second analog gain stage channel:
applying an input signal voltage across a programmable attenuator network;
selecting an attenuation value for attenuating the input signal voltage;
controlling the programmable attenuator network to attenuate the input signal voltage by the selected attenuation value; and
applying the attenuated input signal voltage to the analog gain stage under test to generate an output voltage; and
comparing the output voltage of the first analog gain stage channel to the output voltage of the second analog gain stage channel.

13. A method according to claim 12 further comprising:
testing the analog gain stage at die sort, while an integrated circuit die containing the analog gain stage is attached to a semiconductor wafer.

14. A method according to claim 12 further comprising:
selecting the attenuation values in the first analog gain stage channel and the second analog gain stage channel to have different values; and
applying a substantially identical input signal voltage to the programmable attenuator network of the first analog gain stage channel and the second analog gain stage channel.

15. A method according to claim 14 further comprising:
comparing the output voltage of the first analog gain stage channel to the output voltage of the second analog gain stage channel using a first comparator;
comparing the output voltage of the second analog gain stage channel to the output voltage of the first analog gain stage channel using a second comparator; and
determining whether the first comparator and the second comparator consistently compare the output voltages.

16. A method according to claim 12 further comprising:
controlling selection of the attenuation value and timing of the applying steps using a control block.

17. A method according to claim 16 further comprising the act of supplying the control block as a circuit in an integrated circuit die containing the analog gain stage.

18. A method according to claim 16 further comprising the act of supplying the control block from an external tester via test pins on an integrated circuit die containing the analog gain stage.

19. A method according to claim 12 further comprising:
selecting the attenuation values in the first analog gain stage channel and the second analog gain stage channel to be numerically consecutive integer values; and
applying an identical input signal voltage to the programmable attenuator network of the first analog gain stage channel and the second analog gain stage channel.

20. A method according to claim 12 further comprising:
for the first analog gain stage channel and the second analog gain stage channel, selecting the input signal voltage for application across a programmable attenuator network.

21. A method according to claim 20 wherein the input signal voltage is selected as an input voltage minus a reference voltage.

22. A method of providing a Built-In Self-Test circuit for testing an analog gain stage in a multiple-channel system, the method comprising:
providing a first channel programmable attenuator network having a first input terminal for receiving a reference voltage, a second input terminal for receiving an input signal voltage, a control terminal for receiving a gain signal, and an output terminal coupled to an input terminal of a first channel analog gain stage;
providing a first channel comparator having a first input terminal coupled to receive a signal selected from an output voltage of the first channel analog gain stage and the input signal voltage, a second input terminal coupled to receive a signal selected from an output voltage of a second channel analog gain stage and the reference voltage;
providing a second channel programmable attenuator network having a first input terminal for receiving a reference voltage, a second input terminal for receiving an input signal voltage, a control terminal for receiving a gain signal, and an output terminal coupled to an input terminal of the second channel analog gain stage; and
providing a second channel comparator having a first input terminal coupled to receive a signal selected from an output voltage of the second channel analog gain stage and the input signal voltage, a second input terminal coupled to receive a signal selected from an output voltage of the first channel analog gain stage and the reference voltage.

23. A method according to claim 22 further comprising:
providing an input switch circuit coupled to the first channel programmable attenuator network for alternatively coupling a voltage selected from a Built-In Self-Test voltage and the input voltage to the second input terminal of the first channel programmable attenuator network.

24. A method according to claim 22 further comprising:
providing a comparator switch circuit coupled to the second channel comparator for alternatively coupling a voltage selected from the output voltage of the first channel analog gain stage and the input signal voltage to the first input terminal and for alternatively coupling a voltage selected from the output voltage of the second channel analog gain stage and the reference voltage to the second input terminal.

25. A method according to claim 22 further comprising:
providing an attenuator decode circuit having a plurality of input lines for receiving a gain control signal and a plurality of output lines coupled to the control terminal of the first channel programmable attenuator network.

26. A method according to claim 22 further comprising:
providing a control circuit including an up/down counter and a state machine, the control circuit for selectively coupling voltages to the first input terminal and the second input terminal of the first channel comparator.

27. A method according to claim 22 further comprising:
providing a control circuit including an up/down counter and a state machine, the control circuit for determining a gain signal applied to the first channel programmable attenuator network.

* * * * *